(12) United States Patent
Katsurai et al.

(10) Patent No.: US 12,155,358 B2
(45) Date of Patent: Nov. 26, 2024

(54) TRANSIMPEDANCE AMPLIFIER

(71) Applicant: Nippon Telegraph and Telephone Corporation, Tokyo (JP)

(72) Inventors: Hiroaki Katsurai, Musashino (JP); Kimikazu Sano, Musashino (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 520 days.

(21) Appl. No.: 17/604,672

(22) PCT Filed: May 8, 2019

(86) PCT No.: PCT/JP2019/018458
§ 371 (c)(1),
(2) Date: Oct. 18, 2021

(87) PCT Pub. No.: WO2020/225893
PCT Pub. Date: Nov. 12, 2020

(65) Prior Publication Data
US 2022/0216841 A1    Jul. 7, 2022

(51) Int. Cl.
*H03F 3/45* (2006.01)
*H03F 1/02* (2006.01)
*H03G 3/30* (2006.01)
*H03K 19/21* (2006.01)

(52) U.S. Cl.
CPC ....... *H03F 3/45475* (2013.01); *H03F 1/0205* (2013.01); *H03G 3/30* (2013.01); *H03K 19/21* (2013.01)

(58) Field of Classification Search
CPC .... H03F 3/45475; H03F 1/0205; H03F 1/086; H03F 3/08; H03G 3/30; H03G 3/3084; H03K 19/21

USPC .................................... 330/308; 250/214 A
See application file for complete search history.

(56) References Cited

U.S. PATENT DOCUMENTS

| | | | | | |
|---|---|---|---|---|---|
| 5,812,030 | A | * | 9/1998 | Inami | H03G 3/3084 250/214 AG |
| 6,246,282 | B1 | * | 6/2001 | Oono | H03G 3/3084 330/308 |
| 7,809,285 | B2 | * | 10/2010 | Nishimura | H03F 1/08 398/209 |

(Continued)

FOREIGN PATENT DOCUMENTS

| | | |
|---|---|---|
| JP | S57-67331 A | 4/1982 |
| JP | S62-75639 U | 5/1987 |

(Continued)

OTHER PUBLICATIONS

Xin Yin, et al., "Experiments on 10 Gb/s Fast Settling High Sensitivity Burst-Mode Receiver with On-Chip Auto-Reset for 10G-G PONs", OFC/NFOEC Technical Digest, 2012, NTu1J.4.

*Primary Examiner* — Hieu P Nguyen
(74) *Attorney, Agent, or Firm* — Workman Nydegger (57) ABSTRACT

A reset signal is generated by a TIA circuit alone. In an embodiment, a transimpedance amplifier configured to convert a current signal into a voltage signal includes a transimpedance stage, a gain control circuit configured to compare an output of the transimpedance stage with a reference voltage and output a gain control voltage, and a reset signal output circuit configured to output a reset signal having a predetermined pulse width at a timing of at least one of a rise or a fall of the gain control voltage.

8 Claims, 9 Drawing Sheets

(56) References Cited

U.S. PATENT DOCUMENTS

| | | | |
|---|---|---|---|
| 8,653,433 B2 * | 2/2014 | Mashimo | H04B 10/6931 |
| | | | 250/214 AG |
| 2010/0231295 A1 | 9/2010 | Hara | |
| 2017/0024970 A1 | 10/2017 | Mita | |

FOREIGN PATENT DOCUMENTS

| | | |
|---|---|---|
| JP | 2001-111395 A | 4/2001 |
| JP | 2010-213128 A | 9/2010 |
| WO | 2012/066634 A1 | 5/2012 |
| WO | 2016/035374 A1 | 3/2016 |

* cited by examiner

TRANSIMPEDANCE AMPLIFIER

TECHNICAL FIELD

The present disclosure relates to a transimpedance amplifier, for example, to a transimpedance amplifier that is used in a optical receiver and converts and amplifies a current signal into a voltage signal.

BACKGROUND ART

In a optical receiver used for optical communications, typically, an optical signal is converted into a current signal by a light receiving element such as a photo diode (hereinafter abbreviated as PD); thereafter, the current signal is converted into a voltage signal and the signal intensity is amplified by an electrical amplifier represented by a transimpedance amplifier (hereinafter referred to as a TIA). Among the TIAs, a TIA applied to a passive optical network (PON) used in fiber to the home (FTTH) or the like is referred to as a burst TIA (BTIA). The BTIA is required to respond to optical signals having intensity differences and being intermittent, that is burst optical signals, at high speed and convert the burst optical signals into voltage signals. It is a problem of the BTIA to manage response performance and consecutive identical code tolerance at the same time.

In a optical receiver, in order to receive optical signals having intensity differences, the gain of an amplifier needs to be variable to widen a dynamic range as the amplifier. Furthermore, in order to output a correct waveform as a differential signal, an offset voltage or a threshold voltage inside a circuit needs to be changed in accordance with the intensity of an input signal.

Figure 1:
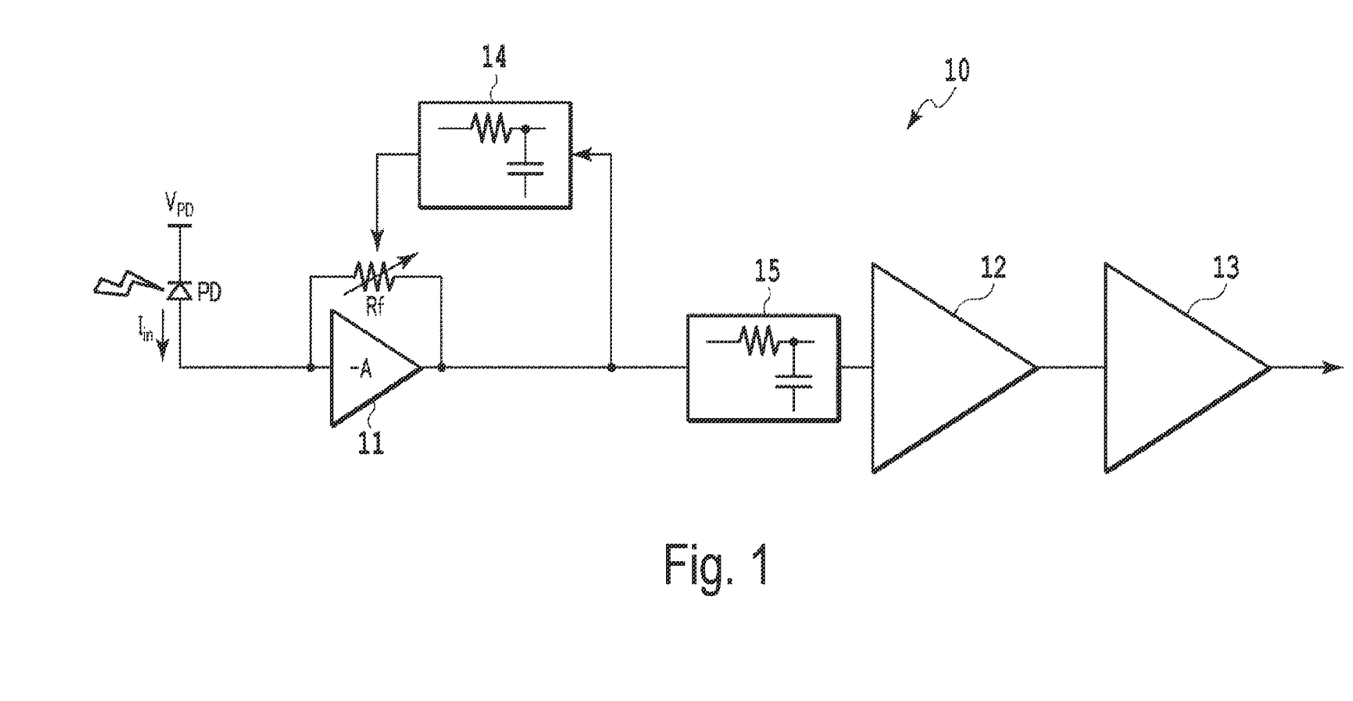
FIG. 1 illustrates a circuit configuration of a BTIA equipped with an AGC and an AOC of related art.

FIG. 1 illustrates a circuit configuration of a BTIA equipped with an AGC and an AOC of an example of related art. In a BTIA 10, a transimpedance stage 11 configured to convert a current signal Iin, which is converted by a light receiving element PD, into a voltage signal, an intermediate buffer 12, and an output buffer 13 are connected in sequence. In the transimpedance stage 11, the gain is adjusted by an automatic gain control circuit (hereinafter, referred to as an AGC) 14 in such a manner that the output is not distorted even when a high intensity optical signal is received. Between the transimpedance stage 11 and the intermediate buffer 12, an automatic offset control circuit (hereinafter, referred to as an AOC) 15 is interposed to adjust the offset in accordance with the intensity of the input signal. In the BTIA, the response speed is determined by time constants of the two control circuits.

When each of the time constants is small, it is possible to achieve a high speed response. On the other hand, since a burst optical signal to be received is a data signal, various patterns are included therein, and a pattern in which an identical code consecutively appears is also present. When the time constant is small, the gain or the offset voltage is changed depending on the length of the pattern in the successive state, which may cause a code error to occur.

Thus, as one of the BTIA schemes, a reset signal is generated to distinguish between a burst period in which a burst optical signal is received and a no-signal period in which there is no burst optical signal, thereby changing the time constant. At a leading portion of the burst optical signal, the time constant is made small by detecting the reset signal to achieve a high speed response, and during the burst period, the time constant is made large to enhance the consecutive identical code tolerance.

Figure 2:
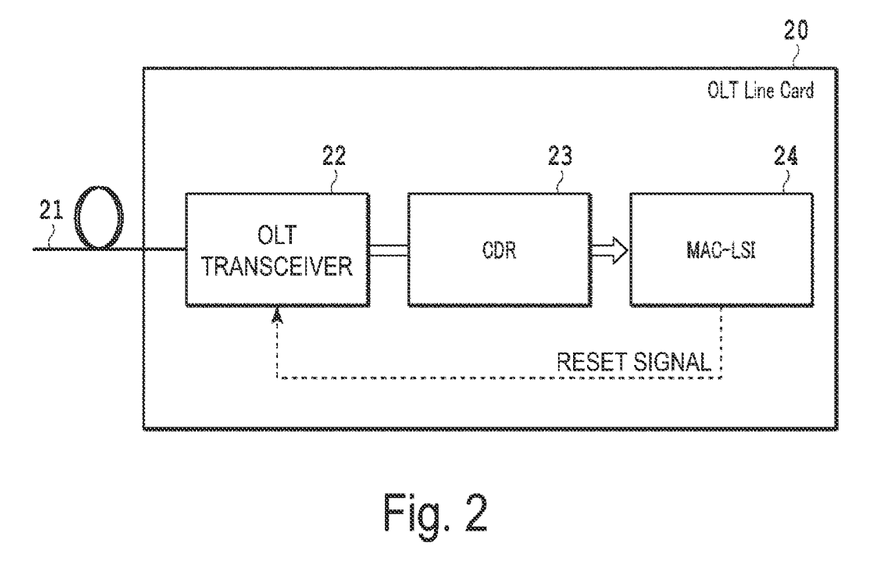
FIG. 2 illustrates a configuration of a receiver of related art configured to be inputted with a reset signal from the outside.

FIG. 2 illustrates a configuration of a receiver of related art configured to be inputted with a reset signal from the outside. Illustrated is a configuration of a line card of an optical line terminal (OLT) installed on a station side in a PON. In the line card 20, an OLT transceiver 22 connected to an optical fiber 21, a clock and data recovery (CDR) circuit 23, and a control LSI (MAC-LSI) 24 are connected in sequence. In the PON, the timing at which each of optical network units (ONUs) on a subscriber side transmits data is assigned by the optical line terminal (OLT) on the station side. From this, it is possible for the control LSI (MAC-LSI) of the OLT to generate a reset signal.

However, since the CDR circuit 23 is present between the OLT transceiver 22, in which a BTIA is mounted, and the MAC-LSI 24, the reset signal needs to be wired in the form of bypassing the CDR circuit 23. The MAC-LSI 24 needs to be equipped with a circuit for generating the reset signal and needs to be designed integrally including the wiring inside the line card 20, which brings about poor versatility. In addition, the OLT transceiver 22 is typically configured so as to be inserted and extracted, and therefore it is undesirable to become a non-compatible dedicated product.

Thus, a method for producing a reset signal at only the optical receiver side without using the reset signal from the MAC-LSI is known. For example, in a burst mode optical receiver of Non Patent Literature 1, the end of a burst signal is detected by counting a signal pattern immediately before the final output stage of a limiting amp (LA). In addition, a common potential of a differential input portion of the LA is changed in a no-signal period between burst periods by combining a circuit configured to detect the presence or absence of data. The BTIA generates a reset signal to change a time constant of the BTIA by detecting a change in common potential of a differential output portion of an output buffer to be connected to the LA.

The OLT transceiver is a component able to be inserted and extracted on the line card, and therefore it is undesirable to become a dedicated product. The BTIA also becomes a component integrated with a PD, which is called a receiver optical subassembly (ROSA), and is mounted on the OLT transceiver. Therefore, the scheme in which the dedicated TIA and the LA are combined as described in Non Patent Literature 1 is poor in compatibility and undesirable. Furthermore, there exists a problem that a circuit to count data signals is needed inside the LA, thereby increasing power consumption and the circuit area.

CITATION LIST

Non Patent Literature

Non Patent Literature 1: Xin Yin, et al., "Experiments on 10 Gb/s Fast Settling High Sensitivity Burst-Mode Receiver with On-Chip Auto-Reset for 10G-G PONs", OFC/NFOEC Technical Digest, 2012, NTu1J.4.

SUMMARY OF THE INVENTION

An object of the present disclosure is to achieve a reset signal generated by a TIA circuit alone.

In order to accomplish the above object, in an embodiment of the present disclosure, a transimpedance amplifier configured to convert a current signal into a voltage signal includes a transimpedance stage, a gain control circuit configured to compare an output of the transimpedance stage with a reference voltage and output a gain control voltage, and a reset signal output circuit configured to output a reset signal having a predetermined pulse width at a timing of at least one of a rise or a fall of the gain control voltage.

DESCRIPTION OF EMBODIMENTS

Hereinafter, embodiments of the present disclosure will be described in detail with reference to the drawings. First, automatic gain control of a BTIA of related art will be described with reference to FIG. 3. A BTIA 30 includes a PD configured to receive an optical signal, a transimpedance stage 31, whose input terminal is connected with an anode terminal of the PD, an intermediate buffer 32 connected to an output terminal of the transimpedance stage 31, and an output buffer 33 connected to an output terminal of the intermediate buffer 32, where output of the output buffer 33 is output of the BTIA 30. Typically, it is often the case that, in the intermediate buffer 32, the circuit form is converted from single amplification into differential amplification, but description thereof is omitted herein. Description of an AOC is also omitted.

Figure 3:
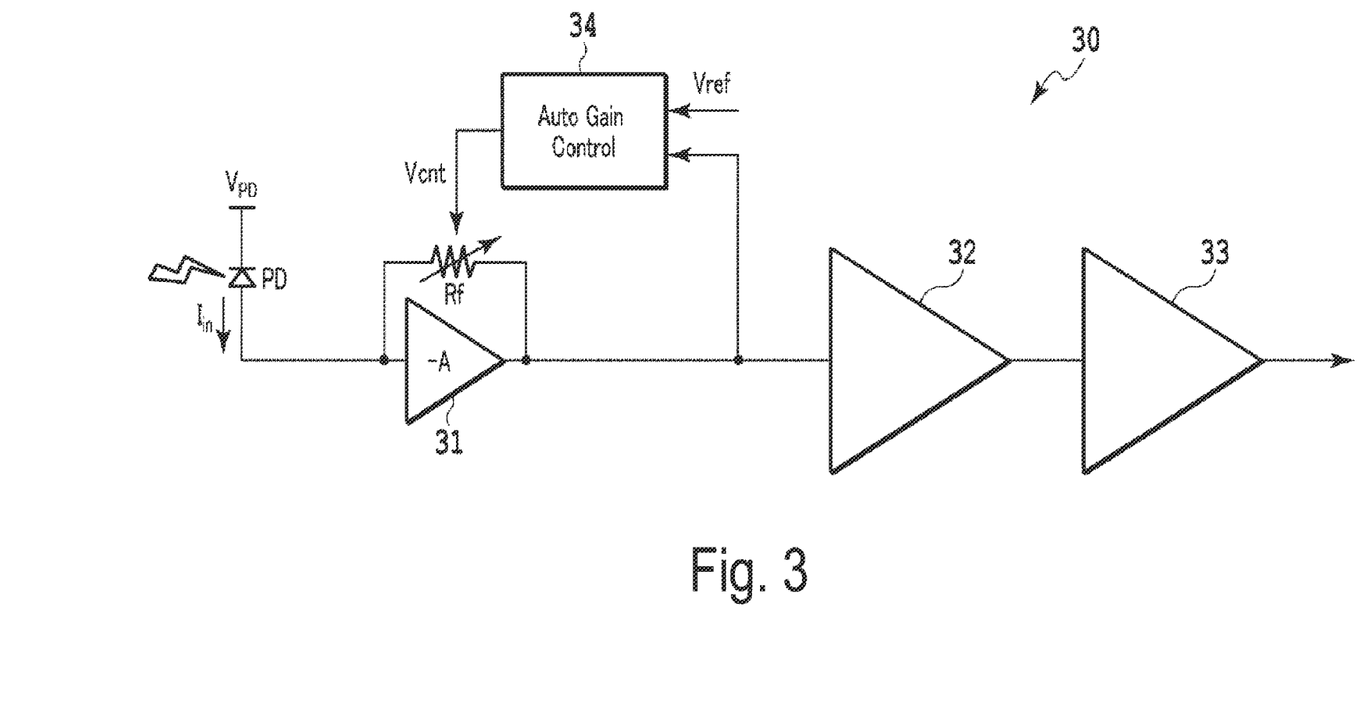
FIG. 3 is a diagram for explaining automatic gain control of a BTIA of related art.

An AGC 34 compares the output of the transimpedance stage 31 with a reference voltage Vref and outputs a gain control voltage Vcnt based on the comparison result. The gain of the transimpedance stage 31 is changed by changing a value of a feedback resistor Rf of the transimpedance stage 31 in accordance with the gain control voltage Vcnt. The gain is lowered when a current signal Iin of a large signal is input, and the gain is increased when a current signal Iin of a small signal is input, thereby widening a dynamic range of the BTIA. Here, it is assumed that the gain is lowered as Vcnt is higher, and the gain is increased as Vcnt is lower.

First Embodiment

Figure 4:
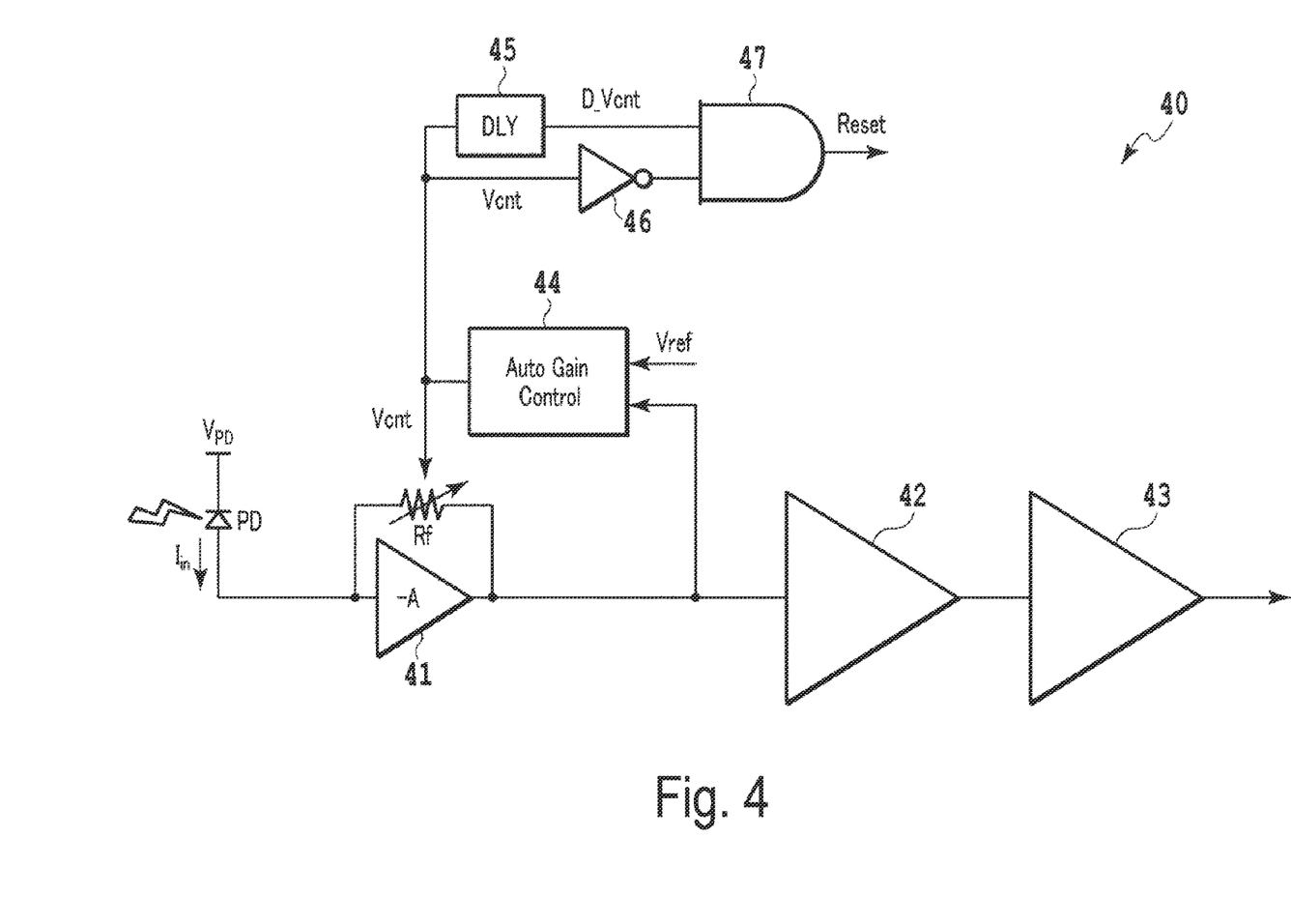
FIG. 4 is a diagram illustrating a circuit configuration of a BTIA according to a first embodiment of the present disclosure.

FIG. 4 illustrates a circuit configuration of a BTIA according to a first embodiment of the present disclosure. A BTIA 40 includes a PD configured to receive an optical signal, a transimpedance stage 41, whose input terminal is connected with an anode terminal of the PD, an intermediate buffer 42 connected to an output terminal of the transimpedance stage 41, and an output buffer 43 connected to an output terminal of the intermediate buffer 42, where output of the output buffer 43 is output of the BTIA 40. Further, the BTIA 40 includes an AGC 44 configured to compare the output of the transimpedance stage 41 with a reference voltage Vref and output a gain control voltage Vcnt, and a reset signal (Reset) output circuit.

The reset signal output circuit is constituted of a delay circuit 45 configured to delay the gain control voltage Vcnt, a NOT circuit 46 configured to invert Vcnt, and an AND circuit 47 configured to output a logical conjunction of the delayed voltage and inverted voltage.

Figure 5:
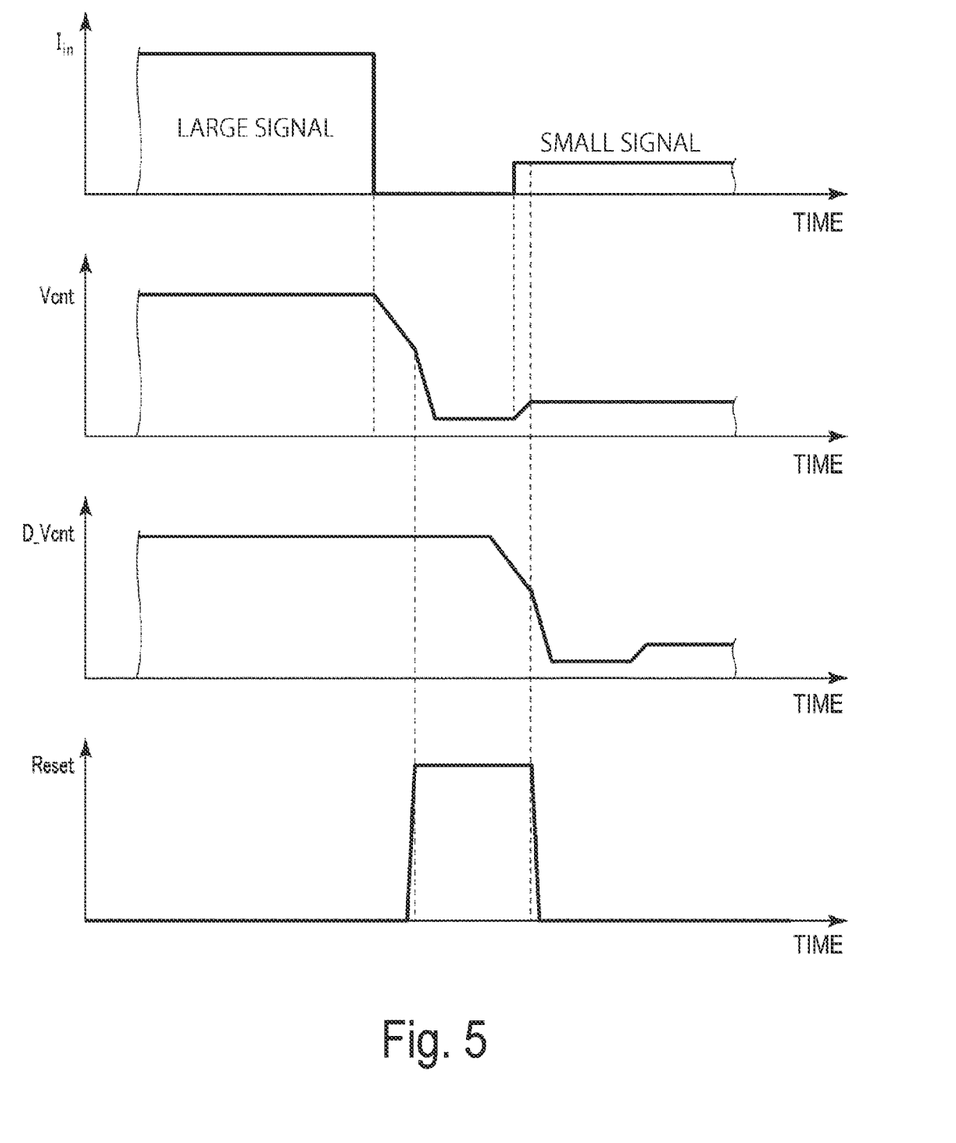
FIG. 5 is a diagram illustrating a timing chart of the BTIA of the first embodiment.

FIG. 5 illustrates a timing chart of the BTIA of the first embodiment. Assuming that each of the inputs to the reset signal output circuit is a binary DC signal of High/Low, the AND circuit 47 outputs a High reset signal when the two inputs are both High, that is, an output D_Vcnt of the delay circuit 45 is High and Vcnt is Low. Accordingly, a pulse having a pulse width in proportion to the amount of delay by the delay circuit 45 is output only at a fall of Vcnt.

Since the response of the AGC 44 depends not only on a time constant inside the circuit but also on the amplitude of the input signal, when a small signal is input after a large signal has continued, the response thereof exhibits the maximum response time. FIG. 5 depicts the timing chart at this time.

As illustrated in FIG. 5, the BTIA 40 configured to receive a burst optical signal outputs a predetermined gain control voltage Vcnt in such a manner as to obtain a gain in proportion to an input current signal Iin during a burst period, but the voltage largely changes (High to Low) when the BTIA 40 enters into a no-signal period. By detecting the fall of the above-mentioned Vcnt, the AND circuit 47 outputs a reset signal.

In a case where the no-signal period between the preceding burst period and the subsequent burst period is sufficiently small, by appropriately setting the amount of delay by the delay circuit 45, the reset signal also extends to a leading portion of the subsequent burst period. Accordingly, by making the time constant small when the burst period is ended and the reset signal is detected, the time constant is small at the initial time when the transition from the no-signal period to the burst period is made again, so that the AGC and AOC respond at high speed, thereby making it possible to shorten the response time.

In a case where the AGC is configured such that the gain is increased as Vcnt is higher, and the gain is lowered as Vcnt is lower, the NOT circuit of the reset signal output circuit is connected to the output D_Vcnt side of the delay circuit.

Second Embodiment

Figure 6:
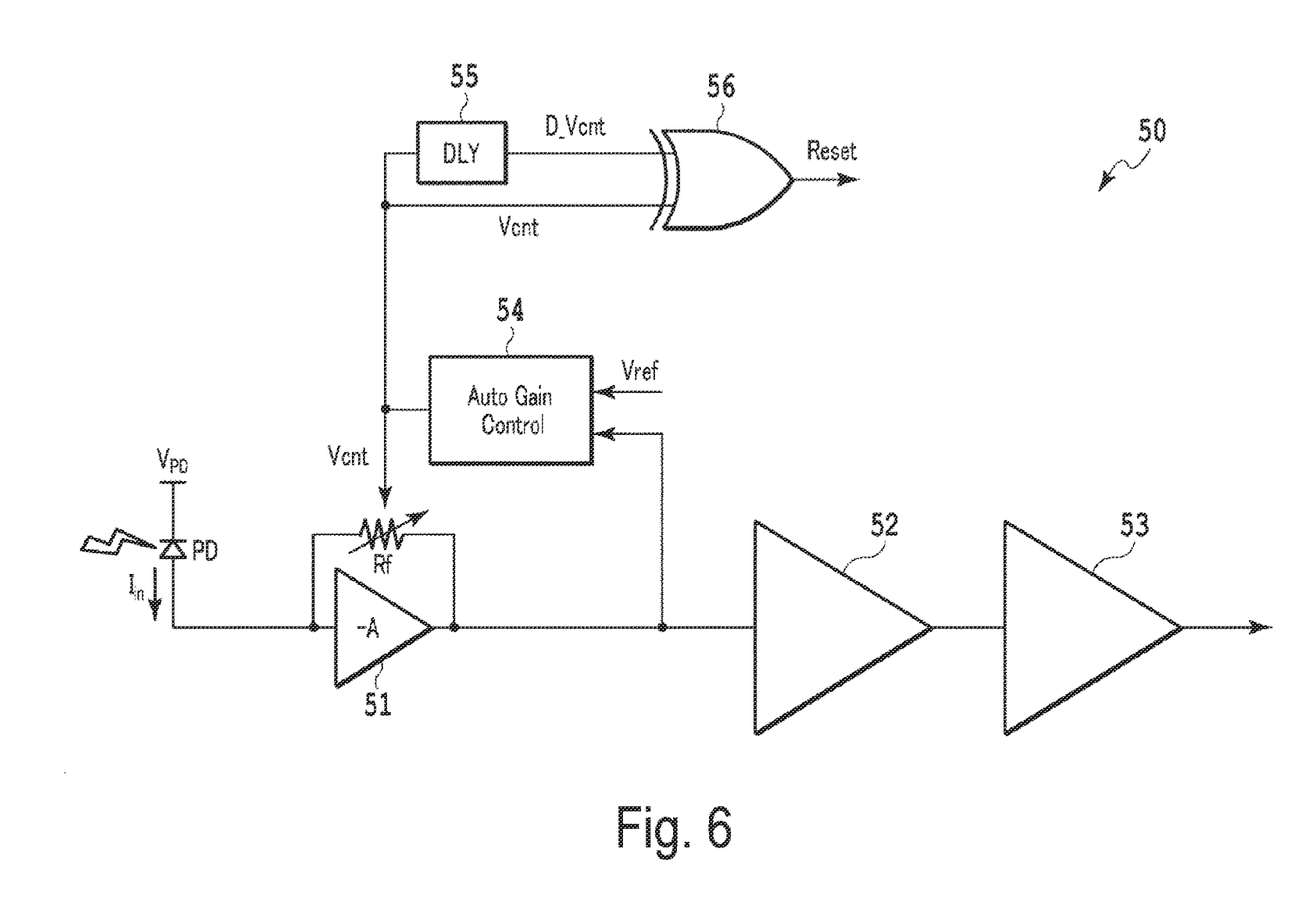
FIG. 6 is a diagram illustrating a circuit configuration of a BTIA according to a second embodiment of the present disclosure.

FIG. 6 illustrates a circuit configuration of a BTIA according to a second embodiment of the present disclosure. A BTIA 50 includes a PD configured to receive an optical signal, a transimpedance stage 51, whose input terminal is connected with an anode terminal of the PD, an intermediate buffer 52 connected to an output terminal of the transimpedance stage 51, and an output buffer 53 connected to an output terminal of the intermediate buffer 52, where output of the output buffer 53 is output of the BTIA 50. Further, the BTIA 50 includes an AGC 54 configured to compare the output of the transimpedance stage 51 with a reference voltage Vref and output a gain control voltage Vcnt, and a reset signal (Reset) output circuit.

The reset signal output circuit is constituted of a delay circuit 55 configured to delay the gain control voltage Vcnt, and an XOR circuit 56 configured to output a result of exclusive OR of Vcnt and the output of the delay circuit 55.

Figure 7:
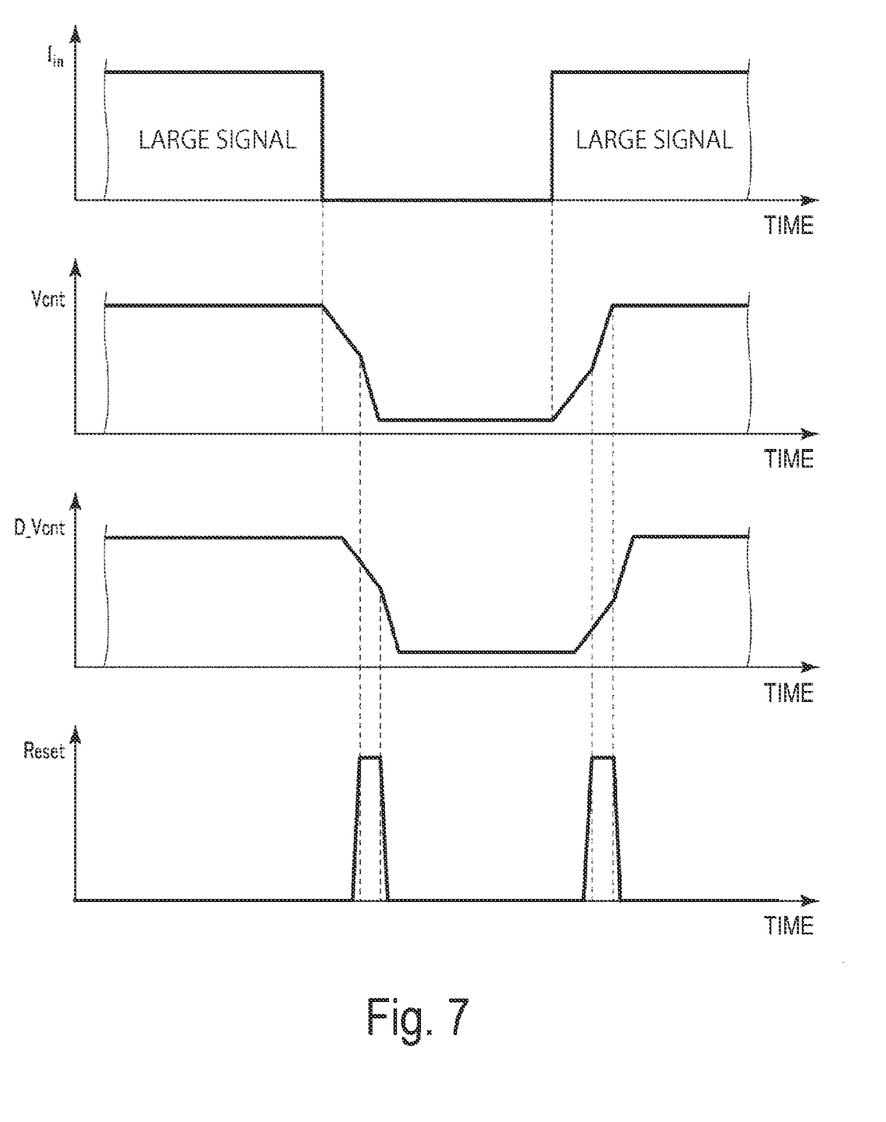
FIG. 7 is a diagram illustrating a timing chart of the BTIA of the second embodiment.

FIG. 7 illustrates a timing chart of the BTIA of the second embodiment. Assuming that each of the inputs to the reset signal output circuit is a binary DC signal of High/Low, the XOR circuit 56 outputs a High reset signal only when any one of the two inputs is High. Accordingly, a pulse having a pulse width in proportion to the amount of delay by the delay circuit 55 is output at a fall and a rise of Vcnt. Thus, by making the time constant small while the reset signal is detected, the time constant is small at the initial time when the transition from a no-signal period to a burst period is made again, so that the AGC and AOC respond at high speed, thereby making it possible to shorten the response time.

Third Embodiment

Figure 8:
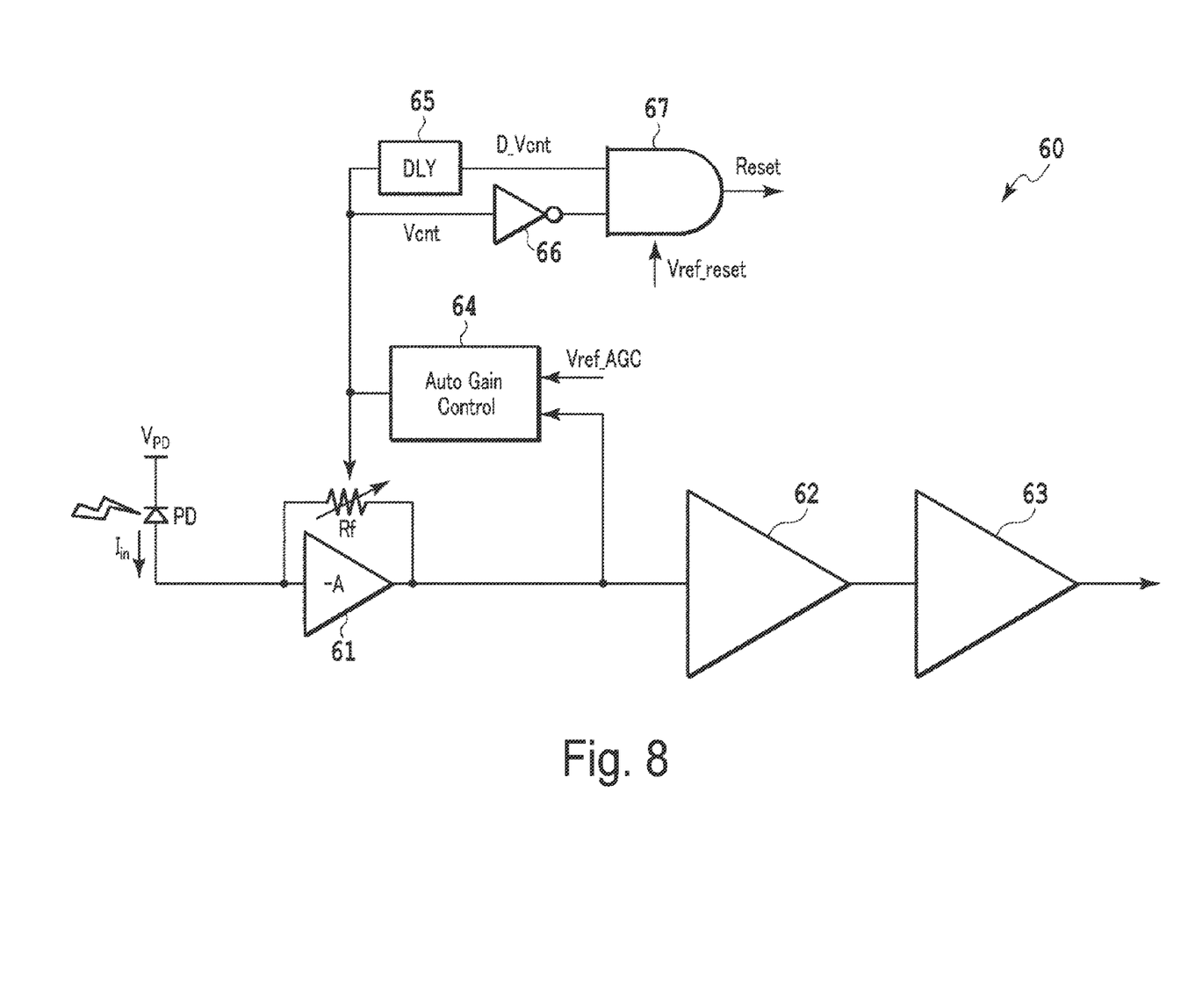
FIG. 8 is a diagram illustrating a circuit configuration of a BTIA according to a third embodiment of the present disclosure.

FIG. 8 illustrates a circuit configuration of a BTIA according to a third embodiment of the present disclosure. A BTIA 60 includes a PD configured to receive an optical signal, a transimpedance stage 61, whose input terminal is connected with an anode terminal of the PD, an intermediate buffer 62 connected to an output terminal of the transimpedance stage 61, and an output buffer 63 connected to an output terminal of the intermediate buffer 62, where output of the output buffer 63 is output of the BTIA 60. Further, the BTIA 60 includes an AGC 64 configured to compare the output of the transimpedance stage 61 with a reference voltage Vref and output a gain control voltage Vcnt, and a reset signal (Reset) output circuit.

The reset signal output circuit is constituted of a delay circuit 65 configured to delay the gain control voltage Vcnt, a NOT circuit 66 configured to invert Vcnt, and an AND circuit 67 configured to output a logical conjunction of the delayed voltage and inverted voltage. In the third embodiment, the AND circuit 67 may adjust an operation point by being inputted with a reference voltage Vref_reset. In the above-mentioned embodiments, for the sake of simplicity, the operation is described assuming that the signal level has only two values of High/Low. In a case where the resistance value of a feedback resistor Rf of the transimpedance stage 61 is not switched but changed continuously, it is desirable that the output of the AND circuit 67 can also be changed continuously. At this time, the operation of the AND circuit depends on the reference voltage that determines the operation point, and in a case where an input signal current in proportion to any light intensity is received, there is a possibility that a reset signal is erroneously output only by the switching of High/Low at the time of large signal input.

Thus, the reference voltage Vref_reset may be input from the outside to determine whether to generate a reset signal at any light intensity. Note that as for the XOR circuit 56 of the reset signal output circuit in the second embodiment as well, the operation point may be adjusted by inputting the reference voltage Vref_reset thereto in a similar manner.

Fourth Embodiment

Figure 9:
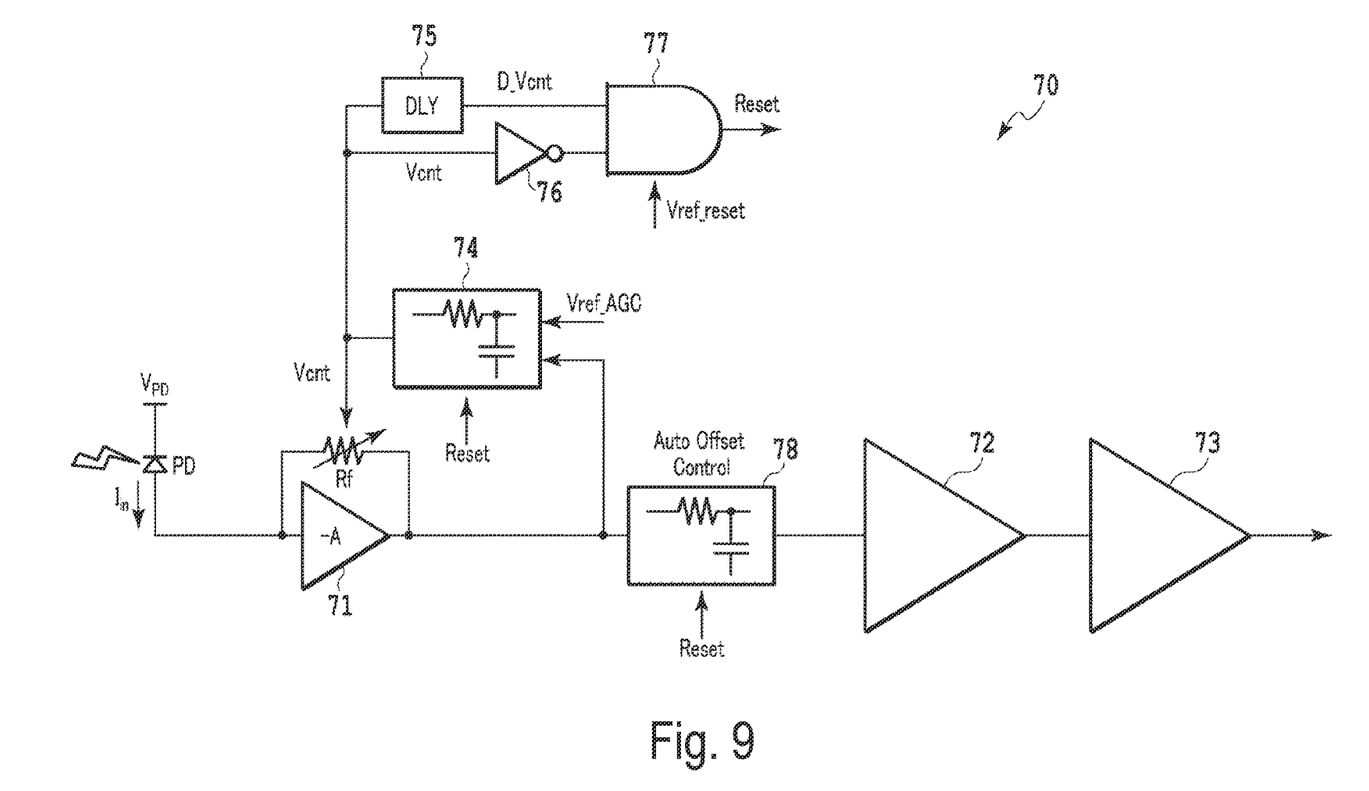
FIG. 9 is a diagram illustrating a circuit configuration of a BTIA according to a fourth embodiment of the present disclosure.

FIG. 9 illustrates a circuit configuration of a BTIA according to a fourth embodiment of the present disclosure. A BTIA 70 includes a PD configured to receive an optical signal, a transimpedance stage 71, whose input terminal is connected with an anode terminal of the PD, an intermediate buffer 72 connected to an output terminal of the transimpedance stage 71, and an output buffer 73 connected to an output terminal of the intermediate buffer 72, where output of the output buffer 73 is output of the BTIA 70. Further, the BTIA 70 includes an AGC 74 configured to compare the output of the transimpedance stage 71 with a reference voltage Vref and output a gain control voltage Vcnt, and a reset signal (Reset) output circuit.

The reset signal output circuit is constituted of a delay circuit 75 configured to delay the gain control voltage Vcnt, a NOT circuit 76 configured to invert Vcnt, and an AND circuit 77 configured to output a logical conjunction of the delayed voltage and inverted voltage. The AND circuit 77, similar to the AND circuit 67 of the third embodiment, may adjust an operation point by being inputted with a reference voltage Vref_reset.

In the fourth embodiment, the reset signal switches time constants of the AGC 74 and an AOC 78. For example, by making the time constant small when the reset signal is detected, the time constant is small at the initial time when the transition from a no-signal period to a burst period is made again, so that the AGC and AOC may respond at high speed, and the time constant is made large during the burst period to enhance the consecutive identical code tolerance.

According to the first to fourth embodiments, in the TIA circuit, by detecting a no-signal period when the light receiving element receives a burst optical signal and generating a reset signal, it is possible to achieve both high speed response and enhancement of the consecutive identical code tolerance.

The invention claimed is:

1. A transimpedance amplifier configured to convert a current signal into a voltage signal, comprising:
    a transimpedance stage;
    a gain control circuit configured to compare an output of the transimpedance stage with a reference voltage and output a gain control voltage; and
    a reset signal output circuit configured to output a reset signal having a pulse width at a timing of at least one of a rise or a fall of the gain control voltage,
    wherein the reset signal output circuit further comprises a delay circuit configured to delay the gain control voltage to produce the reset signal, and sets the pulse width in proportion to a delay amount by the delay circuit.

2. The transimpedance amplifier according to claim 1, wherein the gain control circuit switches a time constant by the reset signal to control a gain of the transimpedance stage.

3. A transimpedance amplifier configured to convert a current signal into a voltage signal, comprising:
    a transimpedance stage;
    a gain control circuit configured to compare an output of the transimpedance stage with a reference voltage and output a gain control voltage; and
    a reset signal output circuit configured to output a reset signal having a predetermined pulse width at a timing of at least one of a rise or a fall of the gain control voltage,
    wherein the reset signal output circuit includes a delay circuit and a NOT circuit connected to an output of the gain control circuit, and an AND circuit to which an output of the delay circuit and an output of the NOT circuit are input, and outputs an output of the AND circuit as a reset signal.

4. The transimpedance amplifier according to claim 2, wherein the AND circuit is configured to have a reference voltage input from an outside.

5. A transimpedance amplifier configured to convert a current signal into a voltage signal, comprising:
    a transimpedance stage;

a gain control circuit configured to compare an output of the transimpedance stage with a reference voltage and output a gain control voltage; and reset signal output circuit configured to output a reset signal having a predetermined pulse width at a timing of at least one of a rise or a fall of the gain control voltage, wherein the reset signal output circuit includes a delay circuit connected to an output of the gain control circuit, and an XOR circuit to which the output of the gain control circuit and an output of the delay circuit are input, and outputs an output of the XOR circuit as a reset signal.

6. The transimpedance amplifier according to claim 5, wherein the XOR circuit is configured to have a reference voltage input from the outside.

7. A transimpedance amplifier configured to convert a current signal into a voltage signal, comprising:

a transimpedance stage;

a gain control circuit configured to compare an output of the transimpedance stage with a reference voltage and output a gain control voltage;

a reset signal output circuit configured to output a reset signal having a predetermined pulse width at a timing of at least one of a rise or a fall of the gain control voltage; and an offset control circuit configured to switch a time constant by the reset signal and switch an output offset of the transimpedance stage.

8. A transimpedance amplifier configured to convert a current signal from a light receiving element into a voltage signal, comprising:

a transimpedance stage having an input terminal to which the light receiving element is connected;

a gain control circuit configured to compare an output of the transimpedance stage with a reference voltage and output a gain control voltage; and a reset signal output circuit configured to output a reset signal having a pulse width at a timing of at least one of a rise or a fall of the gain control voltage, wherein the reset signal detects a no-signal period in a case when the light receiving element receives a burst optical signal, and wherein the reset signal output circuit further comprises a delay circuit configured to delay the gain control voltage to produce the reset signal, and sets the pulse width in proportion to a delay amount by the delay circuit.

* * * * *